United States Patent
Adetutu et al.

(10) Patent No.: US 6,908,852 B2
(45) Date of Patent: Jun. 21, 2005

(54) METHOD OF FORMING AN ARC LAYER FOR A SEMICONDUCTOR DEVICE

(75) Inventors: Olubunmi O. Adetutu, Austin, TX (US); Donald O. Arugu, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/353,886

(22) Filed: Jan. 29, 2003

(65) Prior Publication Data

US 2004/0145029 A1 Jul. 29, 2004

(51) Int. Cl.[7] .................... H01L 21/4763; H01L 21/302
(52) U.S. Cl. ...................... 438/636; 438/724; 438/744; 438/757; 438/791
(58) Field of Search .................. 438/636, 785, 438/786, 791–794, 724, 744, 757; 257/639, 640

(56) References Cited

U.S. PATENT DOCUMENTS

| | | | |
|---|---|---|---|
| 5,918,147 A | | 6/1999 | Filipiak et al. |
| 6,100,559 A | * | 8/2000 | Park .......................... 257/315 |
| 6,294,820 B1 | | 9/2001 | Lucas et al. |

OTHER PUBLICATIONS

Mahorowala et al., "Tunable Anti–Reflective Coatings with Built–in Hard Mask Properties Facilitating Thin Resist Processing," *Emerging Lithographic Technologies V, Proceedings of SPIE*, 2001, vol. 4343, pp. 306–316.

* cited by examiner

*Primary Examiner*—Hung Vu
(74) *Attorney, Agent, or Firm*—David G. Doleza; James L. Cjingan, Jr.

(57) ABSTRACT

An antireflective coating (ARC) layer for use in the manufacture of a semiconductor device. The ARC layer has a bottom portion that has a lower percentage of silicon than a portion of the ARC layer located above it. The ARC layer is formed on a metal layer, wherein the lower percentage of silicon of the ARC layer inhibits the unwanted formation of suicides at the metal layer/ARC layer interface. In some embodiments, the top portion of the ARC layer has a lower percentage of silicon than the middle portion of the ARC layer, wherein the lower percentage of silicon at the top portion may inhibit the poisoning of a photo resist layer on the ARC layer. In one embodiment, the percentage of silicon can be increased or decreased by decreasing or increasing the ratio of the flow rate of a nitrogen containing gas with respect to the flow rate of a silicon containing gas during a deposition process.

32 Claims, 3 Drawing Sheets

METHOD OF FORMING AN ARC LAYER FOR A SEMICONDUCTOR DEVICE

BACKGROUND OF THE INVENTION

1. Field of the Invention

This invention relates in general to semiconductor devices and specifically to antireflective coating (ARC) for semiconductor devices.

2. Description of the Related Art

Antireflective coatings (ARC) are used in the manufacture of semiconductor devices. For example, an ARC layer may be used in a lithography process for reducing unwanted reflections from lower structures (e.g. a gate layer of a transistor) into a photo resist layer located above the ARC layer.

Silicon rich materials (e.g. silicon-rich silicon nitride) can be used as an ARC material. One problem with using a silicon rich material for an ARC layer is that the silicon may react with the underlying material (e.g. metal in a metal layer located below the ARC layer) to form an unwanted silicide layer between the ARC layer and metal layer. This unwanted silicide layer may create a problem during the etch process in that the silicide layer may act as an etch stop layer and prevent the complete etch of the gate stack.

Another problem with a silicon rich ARC layer is that the silicon of the ARC layer may "poison" the photo resist and prevent the complete removal of the photo resist material.

What is needed is an improved ARC layer for the manufacture of a semiconductor device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

FIGS. 1–5 are partial cross-sectional views setting forth one embodiment of a method for making a semiconductor device utilizing an ARC layer having a varying percentage of silicon across the thickness of the ARC layer according to the present invention.

Figure 1:
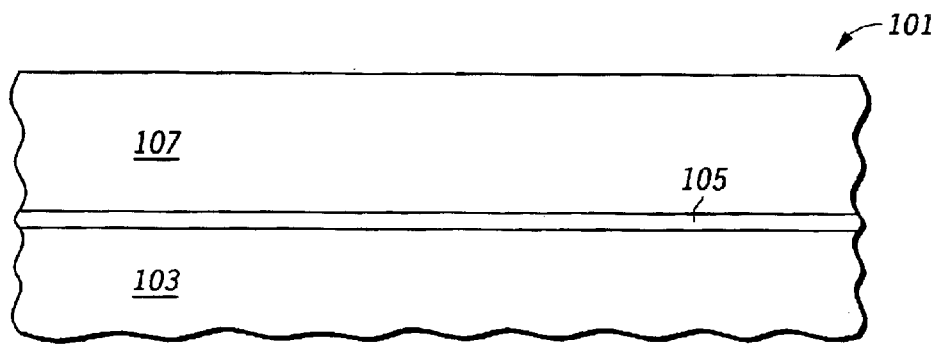
FIG. 1 is a partial cross-sectional view of one embodiment of a semiconductor device during a stage of its manufacture according to the present invention.

FIG. 1 is a cross sectional view of a semiconductor wafer 101 during a stage of its manufacture. Wafer 101 includes a semiconductor substrate 103 and a dielectric layer 105 located on top of substrate 103. Dielectric layer 105, which may be made of e.g. silicon oxide, silicon oxy nitride, metal oxide, metal silicon oxide, metal silicates, or metal aluminates, is used, in one embodiment, for forming a gate dielectric of a transistor. Other conventional structures such as e.g. P-wells, N-wells, or sallow trench isolation structures (STI) etc. (not shown in FIG. 1) may be located in substrate 103.

A metal layer 107 is located on the top of gate dielectric layer 105. Metal layer 107 may be formed e.g. by chemical vapor deposition (CVD), physical vapor deposition (PVD), atomic layer deposition (ALD), or other convention methods. Examples of material that may be used for metal layer 107 include titanium nitride (TiN), tantalum silicon nitride (TaSiN), iridium (Ir), iridium oxide (IrO2), ruthenium (Ru), and ruthenium oxide, tungsten (W), tungsten nitride (WN), and titanium silicon nitride (TiSiN). In one embodiment, metal layer 107 is utilized for forming the gate of a transistor. In some embodiments, metal layer 107 may include multiple layer of different materials.

Figure 2:
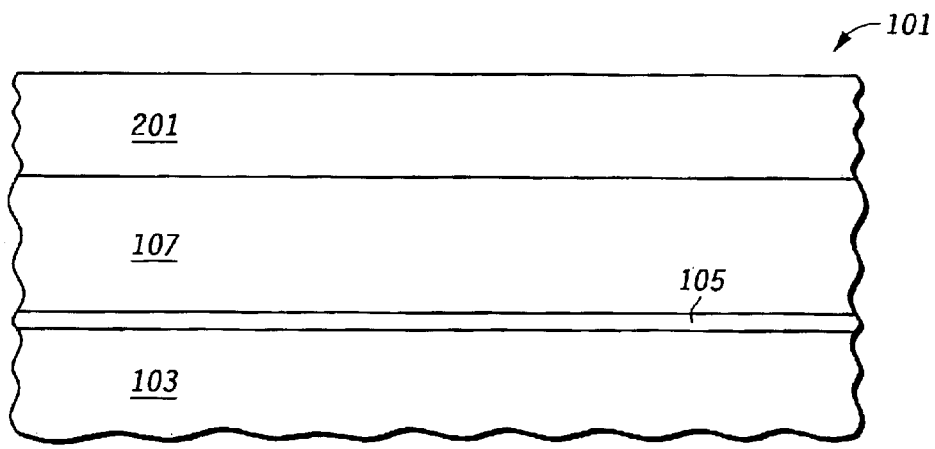
FIG. 2 is a partial cross-sectional view of one embodiment of a semiconductor device during another stage of its manufacture according to the present invention.

Referring to FIG. 2, an ARC layer 201 is formed on metal layer 107. ARC layer 201 may be formed, e.g., by CVD, low pressure CVD (LPCVD), plasma enhanced CVD (PECVD), or an ALD process in either a single wafer deposition chamber (not shown) or a multi-wafer batch furnace (not shown). In one embodiment where layer 201 includes nitrogen and silicon, layer 201 is deposited in a CVD process by exposing metal layer 107 to a nitrogen containing gas (e.g. ammonia (NH3), nitrogen oxide (N2O), nitric oxide (NO), nitrogen) and a silicon containing gas (e.g. silane (SiH4), disilane (Si2H6), dichlorosilane (SiH2Cl2), trisilane (Si3H8), trichlorosilane(SiH2Cl3), and silicon tetrafluoride (SiF4)) in a deposition chamber or furnace. ARC layer 201 may include silicon, silicon oxynitride, metal silicon nitride, or metal silicon oxynitride In one embodiment, the percentage of silicon in layer 201 varies across the thickness of layer 201 from a lower percentage of silicon at the bottom of layer 201 to a higher percentage of silicon at the middle portion of layer 201, and back to a lower percentage of silicon at the top of layer 201. In one embodiment, this varying of the percentage of silicon is achieved by reducing or increasing the gas flow rates of a nitrogen carrying gas during a deposition process. In other embodiments, the percentage of silicon of layer 201 varies from a lower percentage at the bottom of layer 201 to a higher percentage at the top of layer 201.

Providing an ARC layer with a low percentage of silicon at the bottom of the ARC layer 201 may advantageously reduce or eliminate unwanted silicide from forming at the metal layer 107/ARC layer 201 interface. In one embodiment, the percentage of silicon in the material used to form the bottom of layer 201 is such that all the silicon is capable of forming neutral molecular compounds. Accordingly, the amount of silicon available to form unwanted silicide at the ARC layer 201/metal layer 107 interface is significantly reduced. In one embodiment where the ARC layer 201 material is silicon nitride, the bottom portion of layer 201 is stoichmetric silicon nitride (Si3N4).

In other embodiments, the nitrogen concentration of the bottom portion of layer 201 is at least the nitrogen concentration of stoichiometric silicon nitride.

In one embodiment, the material at the middle portion of ARC layer 201 is silicon rich silicon nitride. Increasing the percentage of silicon at a portion above the bottom portion of an ARC layer may increase the antireflective properties of the portion above the bottom portion of the ARC layer. Accordingly, providing an ARC layer having a lower percentage of silicon at its bottom and a higher percentage of silicon at portions above the bottom may provide an ARC layer that will not form unwanted silicide at the metal layer/ARC layer interface and yet have good anti-reflective properties.

Figure 6:
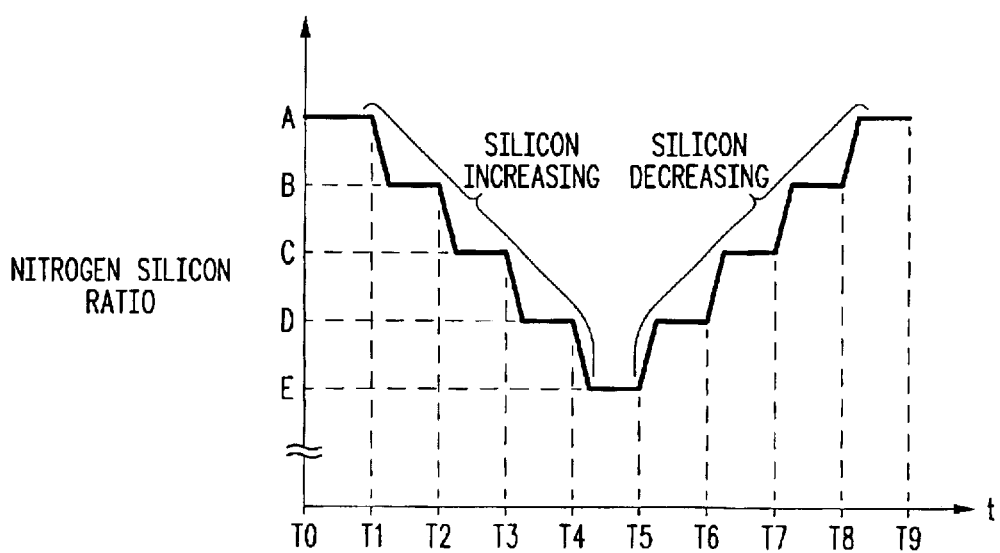
FIG. 6 is a graph of one embodiment showing process details for forming an ARC layer according to the present invention.

FIG. 6 is a graph setting forth process details of one embodiment for forming ARC layer 201 according to the present invention. In the embodiment of FIG. 6, ARC layer 201 is formed by a CVD process from silicon and nitrogen containing gases which react to form a silicon-nitrogen compounds. The graph of FIG. 6 shows the ratio (labeled "NITROGEN/SILICON RATIO" in FIG. 6) of the gas flow rate for the nitrogen containing gas to the gas flow rate of the silicon containing gas during the deposition of layer 201. The horizontal axis represents the deposition time during the deposition process for forming layer 201.

In the embodiment of FIG. 6, at the beginning of the deposition time (T0), the ratio of nitrogen containing gas to silicon containing gas is at its highest ratio (A). The portion of layer 201 deposited at this time is nitrogen rich and contains a relatively low percentage of silicon. In one embodiment, the nitrogen/silicon ratio is 5:1. At T1, the nitrogen/silicon ratio is reduced to ratio B. The portion of layer 201 deposited at this time has a higher percentage of silicon than that portion of layer 201 deposited between T0 and T1. The slope in the nitrogen/silicon ratio from ratio A to ratio B depicts the non instantaneous nature of the change in the gas flow rates for a particular deposition chamber or furnace. At T2, the nitrogen/silicon ratio is reduced to ratio C. The portion of layer 201 deposited at this time has a higher percentage of silicon than that portion of layer 201 deposited between T1 and T2. At T3, the nitrogen/silicon ratio is reduced to ratio D. The portion of layer 201 deposited at this time has a higher percentage of silicon than that portion of layer 201 deposited between T2 and T3. At T4, the nitrogen/silicon ratio is reduced to ratio E. The portion of layer 201 deposited at this time has a higher percentage of silicon than that portion of layer 201 deposited between T3 and T4.

In the embodiment of FIG. 6, the nitrogen/silicon gas ratio is increased after T5 to provide a decreasing percentage of silicon profile to the top of layer 201. At T5, the nitrogen/silicon ratio is increased to ratio D. The portion of layer 201 deposited at this time has a lower percentage of silicon than that portion of layer 201 deposited between T4 and T5. At T6, the nitrogen/silicon ratio is increased to ratio C. The portion of layer 201 deposited at this time has a lower percentage of silicon than that portion of layer 201 deposited between T5 and T6. At T7, the nitrogen/silicon ratio is increased to ratio B. The portion of layer 201 deposited at this time has lower percentage of silicon than that portion of layer 201 deposited between T6 and T7. At T8, the nitrogen/silicon ratio is increased to ratio A. The portion of layer 201 deposited at this time has a lower percentage of silicon than that portion of layer 201 deposited between T7 and T8.

In one embodiment, for depositing an ARC layer having a thickness of 200 A, a refractive index of less than 3.00, and formed on a metal layer of tungsten by CVD in a single wafer deposition chamber where the nitrogen carrying gas is ammonia (NH3) and the silicon carry gas is silane, the following values of the nitrogen/silicon ratio and depositions times, as shown in FIG. 6, are given:

A=5:1, B=4:1, C=3:1, D=2:1, and E=1:1;

T1=2 sec., T2=2 sec., T3=3 sec., T4=3 sec., T5=3 sec., T6=3 sec., T7=2 sec., T8=2 sec., and T9=2 sec.

In the embodiment shown, the nitrogen/silicon ratios (A,B, C, and D) used to deposit portions of layer 201 from T0 to T4 (a portion of the silicon increasing period) are the same as the nitrogen/silicon ratios (D, C, B, and A) used to deposit portions of layer 201 from T5 to T9 (the silicon decreasing period). In other embodiments, the nitrogen/silicon ratios used during the silicon increasing period may be different from the nitrogen/silicon ratios used during the silicon decreasing period. For example, the nitrogen/silicon ratio used to deposit the top portion of layer 201 may be different than the nitrogen/silicon ratio used to deposit the bottom portion of layer 201. In other embodiments, the number of gas ratio steps may be greater where it would include more nitrogen/silicon ratio steps (e.g. A, B, C, D, E, F, and G) or less (e.g. A and B). Furthermore, number of gas ratio steps maybe different in the silicon increasing period from the silicon decreasing period. For example, the deposition process may include a ratio sequence of A, B, C, D, E, D, A. Also with other embodiments, the time at which each gas ratio is applied to the chamber or furnace (e.g. from T4 to T5), may vary with different embodiments as well. Also, in other embodiments, the top portion of an ARC layer may not include a silicon decreasing portion.

For the example given above for the process details described in FIG. 6, the refractive index (n) of layer 201 is 2.44 at a wavelength of 248 nm. The refractive index of layer 201 may be varied by varying the nitrogen/silicon ratios and the thickness of layer 201. The reflective index may be increased by increasing the time from T4–T5 or may be decreased by increasing the time from T0–T1 and T8–T9.

Still in other embodiments, the deposition tool may be configured to continuously decrease or increase the nitrogen/silicon ratio (e.g. such that the graph of FIG. 6 would appear as a "V" or "U").

Figure 7:
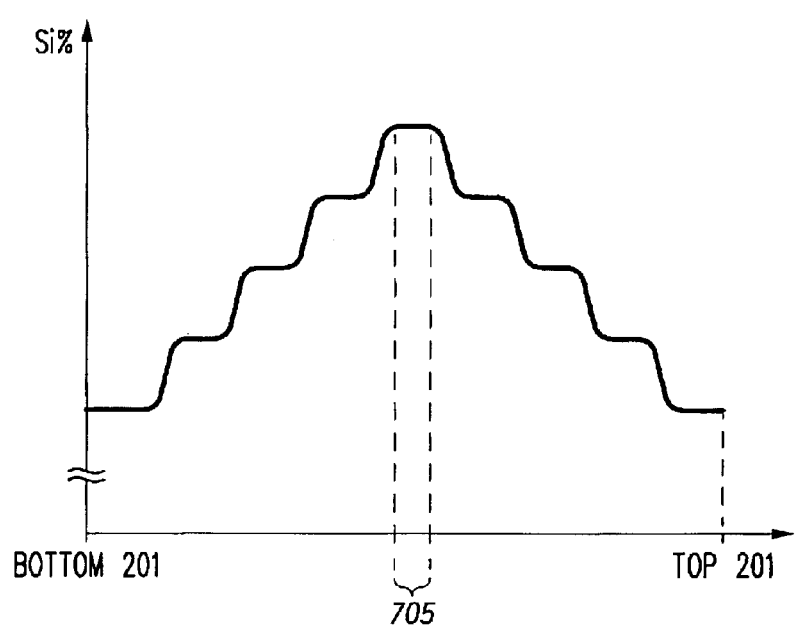
FIG. 7 is a graph showing a profile of the percentage of silicon of an ARC layer according to the present invention.

FIG. 7 is a graph showing a profile of the percentage of silicon of an ARC layer formed according to the process details set forth in FIG. 6. As shown in FIG. 7, the percentage of silicon is at its lowest at the bottom of ARC layer 201 and top of ARC layer 201 and the percentage of silicon is at its highest at the middle 705 portion of ARC layer 201, which is deposited during period T4–T5 (See FIG. 6). ARC layers formed by different processes may have different percentage of silicon profiles.

In other embodiments, other substances in the ARC layer material may be varied to increase or decrease the percentage of silicon in the ARC layer. For example, in a silicon oxynitride ARC, the ratio of oxygen containing gas to silicon containing gas may be varied during deposition in a manner similar to that as shown in FIG. 6 with respect to the varying of the ratio of the nitrogen containing gas to silicon containing gas. Accordingly, the percentage of silicon with respect to oxygen (and with respect to oxygen and nitrogen) can be increased or decreased across the thickness of the ARC layer. Decreasing the ratio of silicon to oxygen (while the amount of nitrogen is kept constant) in forming the bottom portion of the ARC layer also reduces the formation silicide at the ARC layer/metal layer interface. In other embodiments, the amount of oxygen containing gas and nitrogen containing gas may both be reduced or increased during the deposition process so as to vary the percentage of silicon with respect to the silicon reactants (oxygen and nitrogen) across the thickness of the ARC layer.

Figure 3:
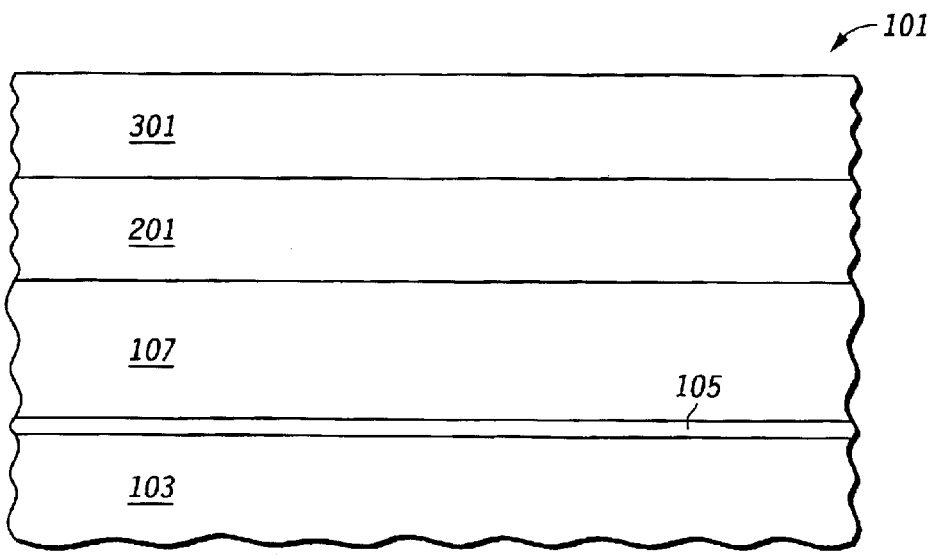
FIG. 3 is a partial cross-sectional view of one embodiment of a semiconductor device during another stage of its manufacture according to the present invention.

FIG. 3 shows wafer 101 at another stage during its manufacture. After the formation of ARC layer 201, a photo resist layer 301 is formed over ARC layer 201. In the embodiments where the percentage of silicon is decreased at the top of ARC layer 201, the relatively low percentage of silicon at the top portion may inhibit the silicon in the top portion of ARC layer 201 from reacting with (poisoning) photo resist layer 301.

Figure 4:
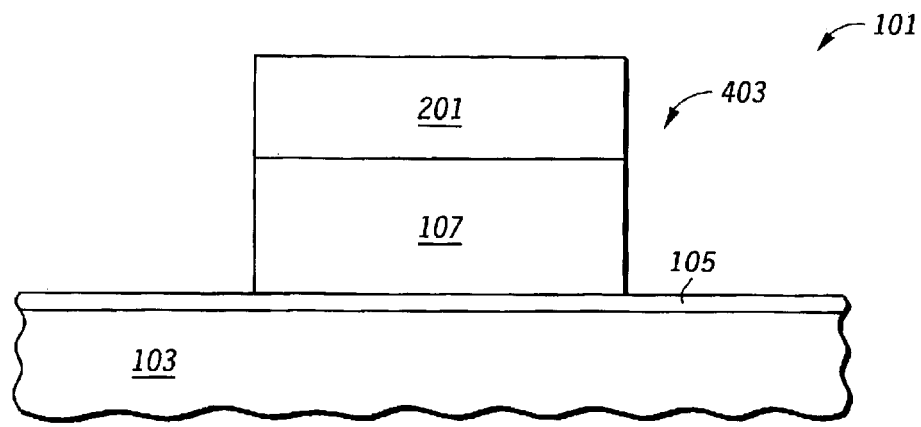
FIG. 4 is a partial cross-sectional view of one embodiment of a semiconductor device during another stage of its manufacture according to the present invention.

FIG. 4 shows a cross sectional view of wafer 101 after the photo resist layer 301 has been patterned to form a pattern (not shown) and ARC layer 201 and metal layer 107 have been etched according to the pattern to form a gate stack 403.

Figure 5:
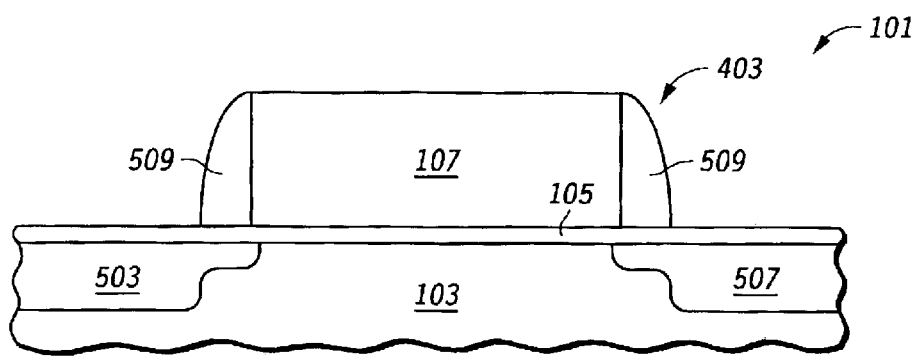
FIG. 5 is a partial cross-sectional view of one embodiment of a semiconductor device during another stage of its manufacture according to the present invention.

FIG. 5 shows a cross sectional view of wafer 101 after the remaining portion of ARC layer 201 is removed (e.g. by a dry etch or a wet etch) and source 503, drain 507, and sidewalls 509 of a transistor are formed. Wafer 101 is further processed by other conventional steps not shown or described.

In other embodiments, an ARC layer according to the present invention may be used to form other structures such as e.g. an interconnecting line or other conductive metal structure. For example, an ARC layer may be formed over a metal layer that is used to form an interconnecting structure. In some of these embodiments, a portion of the ARC layer is not removed during patterning and etch and remains as part of the finally formed semiconductor structure.

In one aspect of the invention, a semiconductor device includes a semiconductor substrate and a metal layer over the substrate. The semiconductor device also includes an anti-reflective coating (ARC) layer on the metal layer having a bottom portion adjacent to the metal layer and a middle portion, wherein the middle portion has a greater percentage of silicon than the bottom portion.

In another aspect of the invention, a method of making a semiconductor device includes forming a metal layer over a semiconductor substrate and depositing an ARC layer over the metal layer by a method that includes mixing a nitrogen-containing gas with a silicon-containing gas over the metal layer at a first ratio of nitrogen to silicon. The method for depositing an ARC layer over the metal layer also includes, after mixing at the first ratio, mixing the nitrogen-containing gas and the silicon-containing gas over the metal layer at a second ratio of nitrogen to silicon. The first ratio is greater than the second ratio.

In another aspect of the invention, a method of forming a semiconductor device includes forming a metal layer over a semiconductor substrate and depositing an ARC layer over the metal layer by a method that includes forming a first portion of the ARC layer having a first ratio of silicon to silicon reactants. The silicon reactants consist of at least one of oxygen and nitrogen. The method for depositing the ARC layer further includes, after forming the first portion, forming a second portion of the ARC layer having a second ratio of silicon to silicon reactants. The second ratio is greater than the first ratio.

In another aspect of the invention, a method of making a semiconductor device includes forming a metal layer over a semiconductor substrate, depositing an ARC layer over the metal layer by a method that includes forming a first portion of the ARC layer having a first percentage of silicon. The method for depositing the ARC layer further includes, after forming the first portion, forming a second portion of the ARC layer having a second percentage of silicon. The second percentage of silicon is greater than the first percentage of silicon.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of making a semiconductor device, comprising:

forming a metal layer over a semiconductor substrate; and depositing an antireflective coating (ARC) layer over the metal layer by a method comprising:

mixing a nitrogen-containing gas with a silicon-containing gas over the metal layer at a first ratio of nitrogen to silicon;

after mixing at the first ratio, mixing the nitrogen-containing gas and the silicon-containing gas over the metal layer at a second ratio of nitrogen to silicon, wherein the first ratio is greater than the second ratio; and after mixing at the second ratio, mixing the nitrogen-containing gas and the silicon-containing gas over the metal layer at a third ratio of nitrogen to silicon, wherein the third ratio is greater than the second ratio.

2. The method of claim 1, wherein forming the ARC layer further comprises:

after mixing at the first ratio and before mixing at the second ratio, mixing the nitrogen-containing gas and the silicon-containing gas over the metal layer at a fourth ratio of nitrogen to silicon, wherein the fourth ratio is less than the first ratio and greater than the second ratio; and after mixing at the second ratio and before mixing at the third ratio, mixing the nitrogen-containing gas and the silicon-containing gas over the metal layer at a fifth ratio of nitrogen to silicon, wherein the fifth ratio is less than the third ratio and greater than the second ratio.

3. The method of claim 1, wherein mixing the nitrogen-containing gas and the silicon-containing gas forms silicon nitride over the metal layer.

4. The method of claim 3, wherein mixing the nitrogen-containing gas and the silicon-containing gas at the first ratio forms silicon nitride with a nitrogen concentration of at least the nitrogen concentration of stoichiometric silicon nitride.

5. The method of claim 1, wherein the silicon-containing gas comprises silane.

6. The method of claim 1, wherein the nitrogen-containing gas comprises ammonia.

7. The method of claim 1, wherein the silicon-containing gas comprises a gas selected from silane, disilane, and dichlorosilane, trisilane, trichlorosilane, and silicon tetrafluoride.

8. The method of claim 1, wherein the nitrogen-containing gas comprises a gas selected from ammonia, nitrogen, nitrogen oxide, and nitrous oxide.

9. The method of claim 1 wherein the ARC layer is deposited on the metal layer.

10. The method of claim 1 further comprising:

depositing a layer of photo resist over the ARC layer;

patterning the layer of photo resist to form a pattern in the layer of photo resist.

11. The method of claim 10 further comprising:
etching the ARC layer and the metal layer according to the pattern to leave a gate stack of a transistor; and
forming a source and a drain of the transistor.

12. The method of claim 10 wherein the layer of photo resist is deposited on the ARC layer.

13. The method of claim 1 wherein the metal layer is formed on a dielectric layer.

14. A method of forming a semiconductor device, comprising:
forming a metal layer over a semiconductor substrate;
depositing an antireflective coating (ARC) layer over the metal layer by a method comprising:
forming a first portion of the ARC layer having a first ratio of silicon to silicon reactants, wherein the silicon reactants consist of at least one of oxygen and nitrogen;
after forming the first portion, forming a second portion of the ARC layer having a second ratio of silicon to silicon reactants, wherein the second ratio is greater than the first ratio; and
after forming the second portion, forming a third portion of the ARC layer having a third ratio of silicon to silicon reactants, wherein the second ratio is greater than the third ratio.

15. The method of claim 14 further comprising:
depositing a layer of photo resist over the ARC layer;
patterning the layer of photo resist to form a pattern in the layer of photo resist.

16. The method of claim 15 further comprising:
etching the ARC layer and the metal layer according to the pattern to leave a gate stack of a transistor; and
forming a source and a drain of the transistor.

17. The method of claim 15 wherein the layer of photo resist is deposited on the ARC layer.

18. The method or claim 14, wherein the forming the ARC layer further comprises:
after forming the first portion and before forming the second portion, forming a fourth portion of the ARC layer having a fourth ratio of silicon to silicon reactants, wherein the fourth ratio is greater than the first ratio and less than the second ratio; and
after forming the second portion and before forming the third portion, forming a fifth portion of the ARC layer having a fifth ratio of silicon to silicon reactants, wherein the fifth ratio is greater than the third ratio and less than the second ratio.

19. The method of claim 14, wherein the ARC layer comprises silicon nitride.

20. The method of claim 14, wherein the ARC layer comprises material selected from silicon nitride, silicon oxynitride, metal silicon nitride, and metal silicon oxynitride.

21. The method of claim 14 wherein the ARC layer is deposited on the metal layer.

22. The method of claim 14 wherein the metal layer is formed on a dielectric layer.

23. A method of making a semiconductor device, comprising:
forming a metal layer over a semiconductor substrate;
depositing an antireflective coating (ARC) layer over the metal layer by a method comprising:
forming a first portion of the ARC layer having a first percentage of silicon;
after forming the first portion, forming a second portion of the ARC layer having a second percentage of silicon, wherein the second percentage of silicon is greater than the first percentage of silicon; and
after forming the second portion, forming a third portion of the ARC layer having a third percentage of Silicon, wherein the second percentage is greater than the third percentage.

24. The method of claim 23 wherein the ARC layer is deposited on the metal layer.

25. The method of claim 23 further comprising:
depositing a layer of photo resist over the ARC layer;
patterning the layer of photo resist to form a pattern in the layer of photo resist.

26. The method of claim 25 further comprising:
etching the ARC layer and the metal layer according to the pattern to leave a gate stack of a transistor; and
forming a source and a drain of the transistor.

27. The method of claim 25 wherein the layer of photo resist is deposited on the ARC layer.

28. The method of claim 23 wherein the metal layer is formed on a dielectric layer.

29. The method of claim 23, wherein the forming the ARC layer further comprises:
after forming the first portion and before forming the second portion, forming a fourth portion of the ARC layer having a fourth percentage of silicon, wherein the fourth percentage is greater than the first percentage and less than the second percentage; and
after forming the second portion and before forming the third portion, forming a fifth portion of the ARC layer having a fifth percentage of silicon, wherein the fifth percentage is greater than the third percentage and less than the second percentage.

30. A method of making a semiconductor device, comprising:
forming a metal layer over a semiconductor substrate;
depositing an antireflective coating (ARC) layer over the metal layer by a method comprising:
mixing a nitrogen-containing gas with a silicon-containing gas over the metal layer at a first ratio of nitrogen to silicon; and
after mixing at the first ratio, mixing the nitrogen-containing gas and the silicon-containing gas over the metal layer at a second ratio of nitrogen to silicon, wherein the first ratio is greater than the second ratio; and
forming a metal gate of a transistor from the metal layer;
wherein depositing the ARC layer further comprises:
after mixing at the second ratio, mixing the nitrogen-containing gas and the silicon-containing gas over the metal layer at a third ratio of nitrogen to silicon, wherein the third ratio is greater than the second ratio.

31. A method of forming a semiconductor device, comprising:
forming a metal layer over a semiconductor substrate;
depositing an antireflective coating (ARC) layer over the metal layer by a method comprising:
forming a first portion of the ARC layer having a first ratio of silicon to silicon reactants, wherein the silicon reactants consist of at least one of oxygen and nitrogen; and
after forming the first portion, forming a second portion of the ARC layer having a second ratio of silicon to silicon reactants, wherein the second ratio is greater than the first ratio; and forming a metal gate of a transistor from the metal layer;

wherein the depositing the ARC layer further comprises:
after forming the second portion, forming a third portion of the ARC layer having a third ratio of silicon to silicon reactants, wherein the second ratio is greater than the third ratio.

32. A method of making a semiconductor device, comprising:

forming a metal layer over a semiconductor substrate;

depositing an antireflective coating (ARC) layer over the metal layer by a method comprising:

forming a first portion of the ARC layer having a first percentage of silicon; and after forming the first portion, forming a second portion of the ARC layer having a second percentage of silicon, wherein the second percentage of silicon is greater than the first percentage of silicon; and forming a metal gate of a transistor from the metal layer;

wherein depositing the ARC layer further comprises;
after forming the second portion, forming a third portion of the ARC layer having a third percentage of silicon, wherein the second percentage is greater than the third percentage.

* * * * *